United States Patent
Cao et al.

(10) Patent No.: US 8,866,261 B2
(45) Date of Patent: Oct. 21, 2014

(54) SELF-ALIGNED SILICIDE BOTTOM PLATE FOR EDRAM APPLICATIONS BY SELF-DIFFUSING METAL IN CVD/ALD METAL PROCESS

(71) Applicant: International Business Machines Corporation, Armonk, NY (US)

(72) Inventors: Qing Cao, Yorktown Heights, NY (US); Sunfei Fang, LaGrangeville, NY (US); Zhengwen Li, Danbury, CT (US); Fei Liu, Yorktown Heights, NY (US); Zhen Zhang, Ossining, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/671,776

(22) Filed: Nov. 8, 2012

(65) Prior Publication Data

US 2014/0117498 A1 May 1, 2014

Related U.S. Application Data

(63) Continuation of application No. 13/665,388, filed on Oct. 31, 2012.

(51) Int. Cl.
*H01L 21/02* (2006.01)

(52) U.S. Cl.
USPC .................................. 257/532; 257/E29.346

(58) Field of Classification Search
USPC .......... 438/343, 244, 386, 387; 257/301, 532, 257/E27.092, E27.095, E29.346, E21.396
See application file for complete search history.

(56) References Cited

U.S. PATENT DOCUMENTS

| | | | |
|---|---|---|---|
| 5,075,251 A | 12/1991 | Torres et al. | |
| 6,441,419 B1 | 8/2002 | Johnson et al. | |
| 6,664,161 B2 | 12/2003 | Chudzik et al. | |
| 6,693,016 B2 | 2/2004 | Gutsche et al. | |
| 6,730,573 B1 | 5/2004 | Ng et al. | |
| 6,750,499 B2 | 6/2004 | Wu | |
| 7,129,130 B2 | 10/2006 | Adkisson et al. | |
| 7,425,740 B2 | 9/2008 | Liu et al. | |
| 7,564,086 B2 | 7/2009 | Kwon et al. | |
| 7,843,035 B2 | 11/2010 | Barth et al. | |
| 2006/0035430 A1* | 2/2006 | Gutsche et al. | 438/243 |
| 2006/0073659 A1 | 4/2006 | Sell et al. | |
| 2007/0264818 A1 | 11/2007 | Nakamura | |
| 2007/0273000 A1 | 11/2007 | Cheng et al. | |
| 2009/0294926 A1 | 12/2009 | Cline et al. | |
| 2012/0086064 A1* | 4/2012 | Cheng et al. | 257/301 |

OTHER PUBLICATIONS

Chen et al., "Determination of Deep Ultrathin Equivalent Oxide Thickness (EOT) From Measuring Flat-Band C-V Curve," IEEE Transactions on Electron Devices, vol. 49, No. 4, Apr. 2002.

* cited by examiner

*Primary Examiner* — Brook Kebede
(74) *Attorney, Agent, or Firm* — Louis J. Percello; Michael J. Chang, LLC

(57) ABSTRACT

In one aspect, a memory cell capacitor is provided. The memory cell capacitor includes a silicon wafer; at least one trench in the silicon wafer; a silicide within the trench that serves as a bottom electrode of the memory cell capacitor, wherein a contact resistance between the bottom electrode and the silicon wafer is from about $1\times10^{-6}$ ohm-cm$^2$ to about $1\times10^{-9}$ ohm-cm$^2$; a dielectric in the trench covering the bottom electrode; and a top electrode in the trench separated from the bottom electrode by the dielectric.

12 Claims, 7 Drawing Sheets

US 8,866,261 B2

SELF-ALIGNED SILICIDE BOTTOM PLATE FOR EDRAM APPLICATIONS BY SELF-DIFFUSING METAL IN CVD/ALD METAL PROCESS

CROSS-REFERENCE TO RELATED APPLICATION(S)

This application is a continuation of U.S. application Ser. No. 13/665,388 filed on Oct. 31, 2012, the disclosure of which is incorporated by reference herein.

FIELD OF THE INVENTION

The present invention relates to memory devices, and more particularly, to techniques for fabricating a memory cell capacitor (e.g., for use in eDRAM device applications) that include a self-aligned silicide process involving a self-diffusing silicide metal(s) for forming a buried/bottom electrode of the capacitor.

BACKGROUND OF THE INVENTION

In eDRAM applications with a deep trench as capacitor, a buried plate (bottom electrode), dielectric and top electrode are needed to form a capacitor for the eDRAM to function. Typically the buried plate is formed by either doped silicon glass (phosphorus- or arsenic-doped silicon glass (ASG)) fill-and-out-diffusion process or ion implantation into the sidewall of deep trenches in a silicon substrate. eDRAM devices having a bottom electrode produced in this manner, however, can suffer from low conductivity issues that slow down eDRAM performance. Further, with eDRAM cell and deep trench scaling down, it is even more challenging to get enough dopant into the buried plate using doped silicon glass (ASG) or ion implantation to form a highly conductive bottom electrode due to the small trench (critical dimension) size and higher aspect ratio.

Therefore, scalable, eDRAM fabrication techniques that address the above-described problems would be desirable.

SUMMARY OF THE INVENTION

The present invention provides techniques for fabricating a memory cell capacitor (e.g., for use in eDRAM device applications) that include a self-aligned silicide process involving a self-diffusing silicide metal(s) for forming a buried/bottom electrode of the capacitor. In one aspect of the invention, a method of fabricating a memory cell capacitor is provided. The method includes the following steps. A silicon wafer is provided. At least one trench is formed in the silicon wafer. A thin layer of metal is deposited onto the silicon wafer, lining the trench, using a conformal deposition process under conditions sufficient to cause at least a portion of the metal to self-diffuse into portions of the silicon wafer exposed within the trench forming a metal-semiconductor alloy, wherein the metal is deposited to a thickness of from about 5 nanometers to about 20 nanometers. The metal is removed from the silicon wafer selective to the metal-semiconductor alloy such that the metal-semiconductor alloy remains. The silicon wafer is annealed to react the metal-semiconductor alloy with the silicon wafer to form a silicide, wherein the silicide serves as a bottom electrode of the memory cell capacitor. A dielectric is deposited into the trench covering the bottom electrode. A top electrode is formed in the trench separated from the bottom electrode by the dielectric.

In another aspect of the invention, a memory cell capacitor is provided. The memory cell capacitor includes a silicon wafer; at least one trench in the silicon wafer; a silicide within the trench that serves as a bottom electrode of the memory cell capacitor, wherein a contact resistance between the bottom electrode and the silicon wafer is from about $1 \times 10^{-6}$ ohm-cm$^2$ to about $1 \times 10^{-9}$ ohm-cm$^2$; a dielectric in the trench covering the bottom electrode; and a top electrode in the trench separated from the bottom electrode by the dielectric.

A more complete understanding of the present invention, as well as further features and advantages of the present invention, will be obtained by reference to the following detailed description and drawings.

DETAILED DESCRIPTION OF PREFERRED EMBODIMENTS

As described above, conventional eDRAM fabrication techniques employ either doped Si glass fill-and-out-diffusion process or ion implantation into sidewall of deep trenches in a silicon substrate to form the buried plate (i.e., bottom electrode). The device could suffer from high resistance issues that lead to slow operation (RC delay). With the continual scaling-down of devices, it gets more difficult to incorporate dopant into high-aspect ratio trenches. These conventional structures are also referred to herein as a metal-insulator-semiconductor (or MIS structure).

Advantageously, the present techniques make use of a metal-insulator-metal (or MIM) capacitor design where the bottom electrode is a metal silicide. Such a MIM capacitor configuration resolves the problems associated with the conventional diffusion/ion implantation processes and shows performance gains. Further, the present techniques are easily scalable, and are effective in deep scaling down scenarios such as 22 nanometer (nm) node with a deep trench critical dimension of 70 nm.

With a conventional MIS structure, an interfacial layer (IL) dielectric with lower k value (e.g., silicon dioxide ($SiO_2$), silicon oxynitride (SiON), etc.) is needed in the film stack for leakage reduction. For instance, a common configuration of an MIS capacitor is silicon (Si)/IL/high-k (HK) dielectric/metal/poly-silicon.

By contrast, in the present MIM capacitor structure, it is possible to eliminate the interfacial low-k dielectric, which will reduce equivalent oxide thickness (EOT) so as to increase capacitance significantly. By way of example only, with an MIS capacitor having an IL dielectric with a thickness of about 12 Angstroms (A) $SiO_2$ (k~4) and a high-k dielectric (k~20) with a thickness of about 60 Å, the EOT is about 26 Å. With the present devices, if the IL dielectric is eliminated, then the EOT is reduced—in this example to 14 Å, so the capacitance can increase by about 90%. Techniques for determining equivalent oxide thickness (EOT) are described, for example, in Chen et al., "Determination of Deep Ultrathin Equivalent Oxide Thickness (EOT) From Measuring Flat-Band C-V Curve," IEEE Transactions on Electron Devices, Vol. 49, No. 4, April 2002, the contents of which are incorporated by reference herein.

Figure 1:
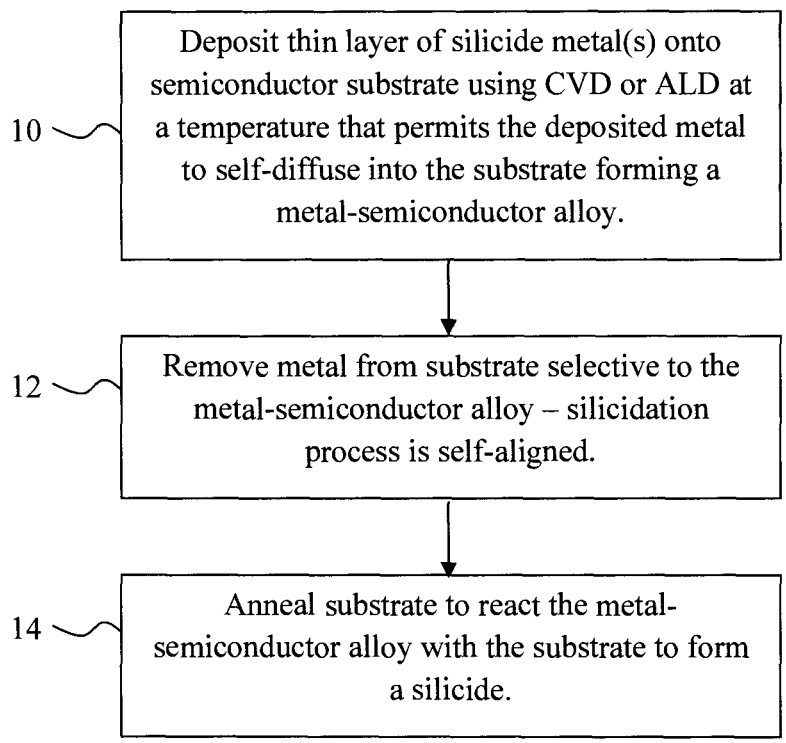
FIG. 1 is a diagram illustrating an exemplary silicidation process according to an embodiment of the present invention.

The present teachings employ a unique self-aligned silicidation process that involves a self-diffusing metal(s). An overview of this silicidation process is provided in FIG. 1. As will be described in detail below, in one exemplary implementation, the silicidation process is used to form a buried/bottom plate of a deep trench memory cell capacitor (e.g., as part of an eDRAM device). Namely, in step 10, a thin layer of metal(s) is deposited onto a semiconductor (e.g., Si) wafer under conditions sufficient to cause at least a portion of the deposited silicide metal(s) to self-diffuse into the wafer. Suitable silicide metals include, but are not limited to, tungsten (W), tantalum (Ta), tungsten nitride (WN), titanium (Ti), and/or platinum (Pt).

According to an exemplary embodiment, the layer of the metal(s) is deposited onto the wafer to a thickness of from about 5 nm to about 20 nm using a conformal deposition process, such as CVD or ALD at a temperature of from about 400° C. to about 700° C. At these temperatures, at least a portion of the deposited metal will diffuse into the wafer forming a metal-semiconductor alloy. It is notable that this self-diffusion will occur only where the metal(s) comes into contact with Si substrate of (exposed regions of) the wafer.

Next, in step 12, the deposited metal is removed from the wafer using a process selective for removing the metal but not the metal-semiconductor alloy. By way of example only, a wet etch will remove the metal, but not the metal-semiconductor alloy. In this manner, the silicidation is a self-aligned process in the sense that the silicide (to be formed below) will be formed only where the metal-semiconductor alloy remains. Namely, any masked or blocked portions of the wafer which do not have the metal in direct contact with Si will not experience the self-diffusion and in step 12, the metal is removed from these regions.

In step 14, the substrate is then annealed to react the metal-semiconductor alloy with the (e.g., Si) wafer to form a silicide. According to an exemplary embodiment, this annealing step is performed at a temperature of greater than about 700° C., e.g., from about 700° C. to about 1,000° C.

Figure 2:
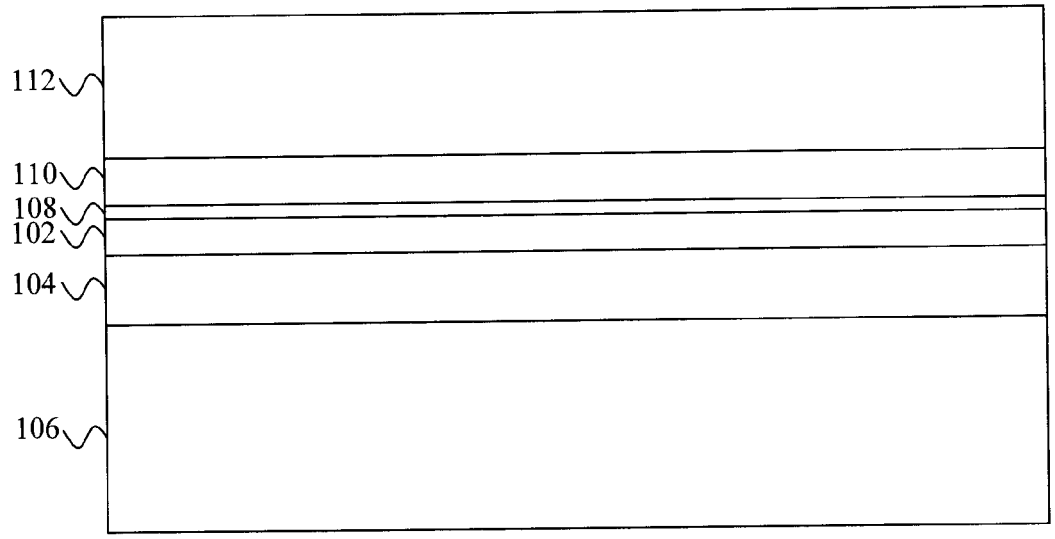
FIG. 2 is cross-sectional diagram illustrating a starting platform for an exemplary eDRAM device fabrication process flow including a silicon-on-insulator (SOI) wafer (having an SOI layer separated from a silicon (Si) substrate by a buried oxide—BOX) and a pad nitride layer and hardmask on the SOI wafer according to an embodiment of the present invention.

In one exemplary implementation of the present techniques, the above-described self-aligned silicidation process is used to fabricate a bottom/buried electrode in a memory cell capacitor. This example is described by way of reference to FIGS. 2-12. FIG. 2 is a diagram illustrating a starting platform for the present process flow. Namely, as shown in FIG. 2, the starting platform includes a silicon-on-insulator (SOI) wafer. An SOI wafer includes an SOI layer (e.g., SOI layer 102) separated from a substrate (e.g., a Si substrate—for example Si substrate 106) by a buried oxide or BOX, e.g., BOX 104. Suitable oxide materials for the BOX include, but are not limited to silicon dioxide ($SiO_2$). By way of example only, the BOX 104 may have a thickness of from about 120 nm to about 150 nm, and the SOI layer 102 may have a thickness of from about 30 nm to about 90 nm.

Figure 7:
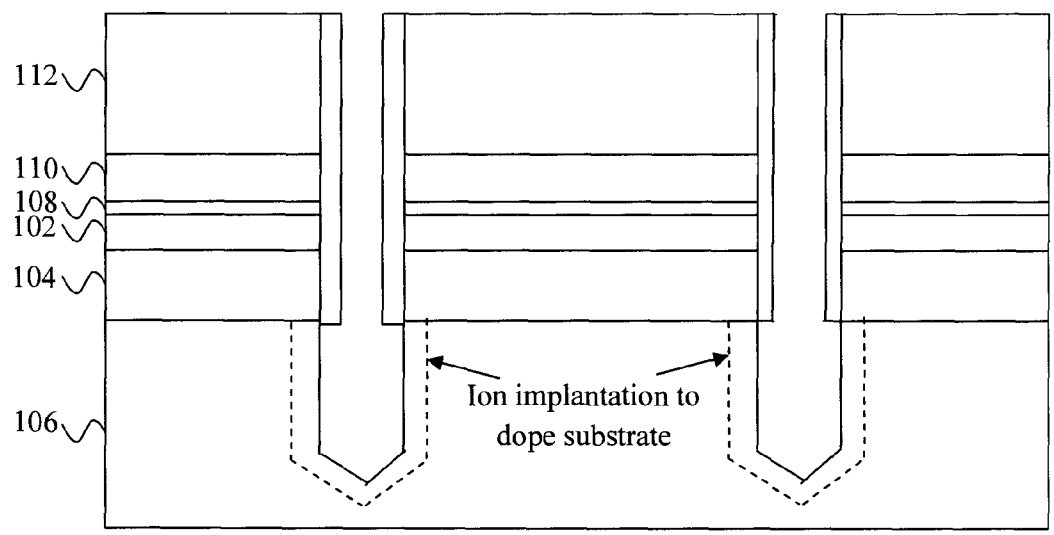
FIG. 7 is a cross-sectional diagram illustrating ion implantation having been used to heavily dope the Si substrate, if not already heavily doped, according to an embodiment of the present invention.

The Si substrate 106 may be doped or undoped. Namely, as will be described in conjunction with the description of FIG. 7, below, if the starting Si substrate 106 is undoped, then a doping step is performed post-deep trench formation. On the other hand, if the starting Si substrate 106 is already doped, then the doping step depicted in FIG. 7 is not necessary. As will be described below, the doping serves to lower the contact resistance between the silicide and the buried Si. According to an exemplary embodiment, the starting Si substrate 106 is heavily doped with boron (B), arsenic (As) or phosphorous (P) at a doping concentration of from about $2 \times 10^{18} cm^3$ to about $5 \times 10^{20}$ $cm^3$.

Next, as shown in FIG. 2, a pad oxide layer 108 is formed on the SOI layer. The pad oxide layer 108 may be formed on the SOI layer 102 by exposing the wafer to an oxygen-containing environment. By way of example only, the pad oxide layer 108 is formed to a thickness of from about 5 nm to about 10 nm.

A nitride pad and hardmask for the deep trench etch (see below) are then formed on the SOI layer 102. Specifically, as shown in FIG. 2, a pad nitride layer 110 is formed on the pad oxide layer 108. According to an exemplary embodiment, the pad nitride layer is formed by depositing (e.g., spin coating) a suitable nitride material onto the wafer. Suitable nitride materials include, but are not limited to silicon nitride (SiN). By way of example only, the pad nitride layer 110 may be formed having a thickness of from about 110 nm to about 130 nm.

Next, a hardmask 112 is formed on the pad nitride layer 110. According to an exemplary embodiment, the hardmask 112 is made of a high-density plasma (HDP) deposited oxide, such as HDP $SiO_2$. By way of example only, the hardmask 112 may be formed having a thickness of from about 900 nm to about 1,100 nm.

Figure 3:
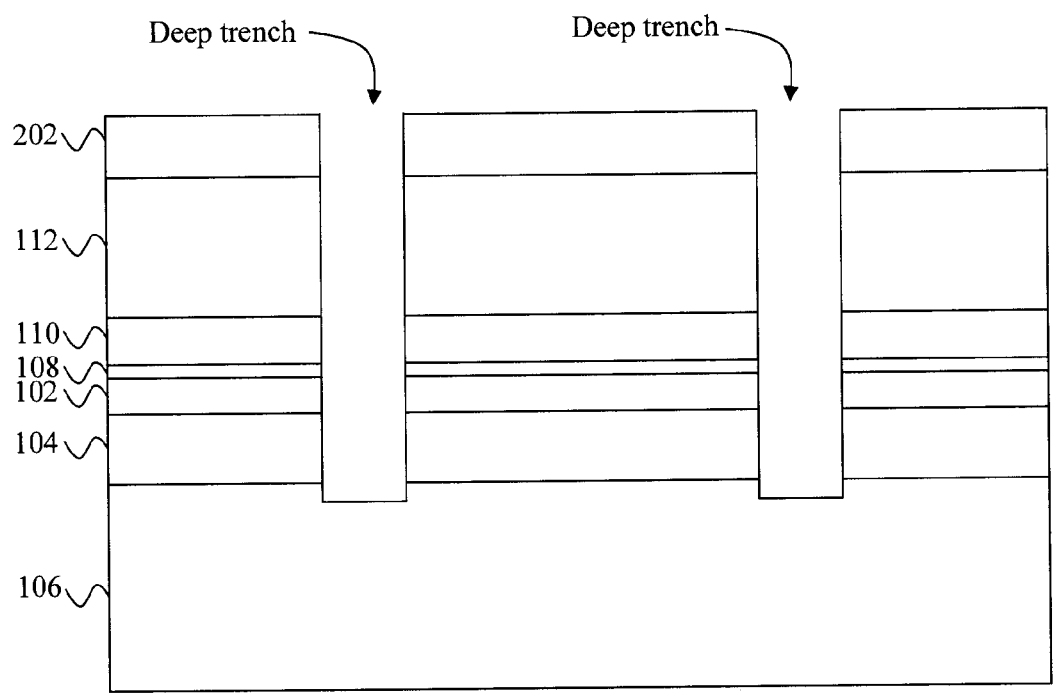
FIG. 3 is a cross-sectional diagram illustrating a deep trench etch through the hardmask (patterned using a resist) having been used to form deep trenches in the hardmask, pad nitride layer and the SOI wafer according to an embodiment of the present invention.

A resist is then used to pattern the hardmask 112, the pad nitride layer 110 and the wafer. See FIG. 3. Namely, as shown in FIG. 3, a resist 202 is formed on the hardmask 112 and used to pattern the hardmask 112 with the foot print and location of one or more trenches using conventional techniques. A trench etch through the patterned hardmask 112 is then performed, wherein the etch is configured to be endpointed to stop at the Si substrate 106. However, as shown in FIG. 3, overetch into the Si substrate 106 is permissible. As will be described below, the trenches are being formed/etched in this step to a first depth and then following formation of sidewall spacers in the trenches the trenches will be extended (i.e., to a second depth). Suitable etching processes for the deep trench etch include, but are not limited to, reactive ion etching (RIE). It is notable that the formation of two trenches in the wafer is merely exemplary and intended to illustrate the present techniques. In practice, the number of trenches formed will depend on the particular device configuration at hand and any given number of trenches can easily be formed using the present teachings.

Figure 4:
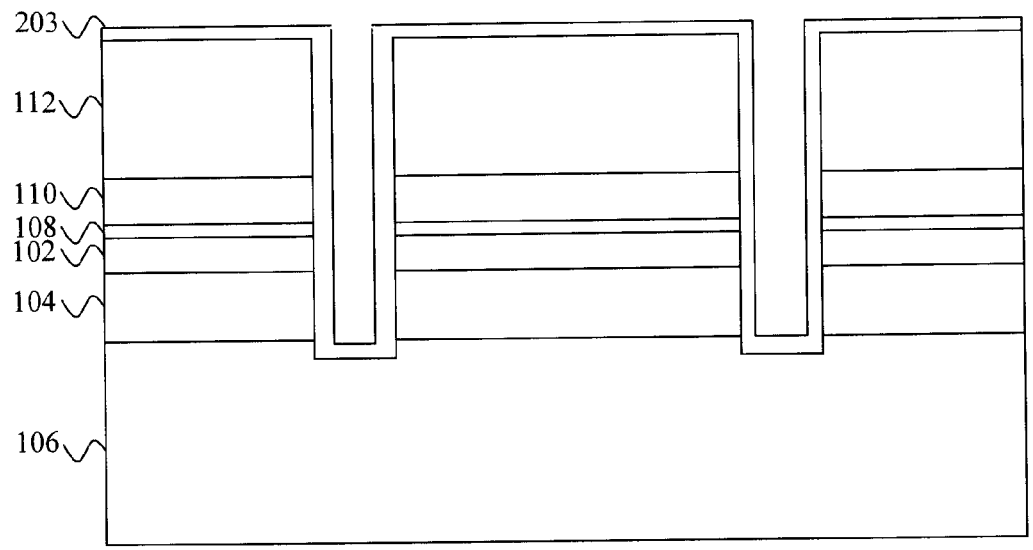
FIG. 4 is a cross-sectional diagram illustrating the resist having been stripped from the wafer and a sidewall spacer having been formed, lining the trenches according to an embodiment of the present invention.

The resist 202 is stripped and a sidewall spacer is deposited lining the trenches. See FIG. 4. Namely, as shown in FIG. 4, the resist has been removed using, e.g., wet etching or dry plasma etching. A sidewall spacer 203 is then deposited onto the wafer, lining the trenches. According to an exemplary embodiment, the sidewall spacer 203 is formed by blanket depositing (e.g., using a conformal deposition process such as CVD) a suitable spacer material onto the wafer. Suitable spacer materials include, but are not limited to, a nitride material such as silicon nitride (SiN). The sidewall spacer 203 will protect the SOI layer 102 during future silicide processes.

Figure 5:
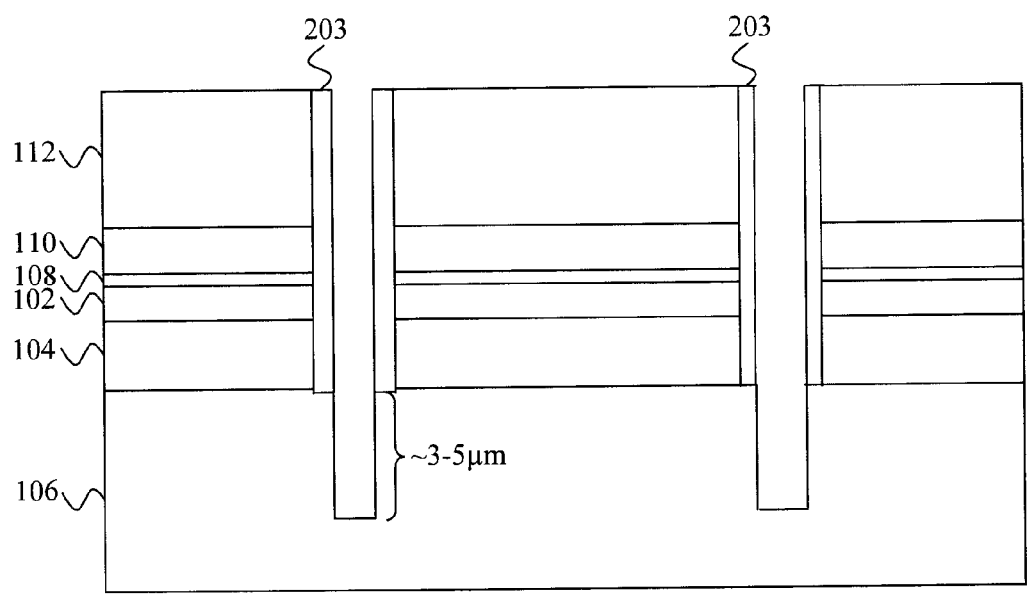
FIG. 5 is a cross-sectional diagram illustrating the trenches having been extended into the Si substrate forming deep trenches in the wafer according to an embodiment of the present invention.

Next, etching is used to extend the trenches into the Si substrate 106. See FIG. 5. This etch serves to form the high-aspect ratio (i.e., deep trenches) of the device. As shown in FIG. 5, the trenches now extend through the SOI layer, through the BOX and partway into the Si substrate. By way of example only, each of the trenches has a depth-to-width aspect ratio of at least 35:1. According to an exemplary embodiment, this etch is performed using a RIE process. As shown in the example illustrated in FIG. 5, this etch is end-pointed when the each trench extends from about 3 micrometers ($\mu$m) to about 5 $\mu$m into the Si substrate 106. As shown in FIG. 5, due to the anisotropic nature of RIE, the sidewall spacer will be removed from the horizontal surfaces (such as from the hardmask 112 and from the bottom of the trenches (compare FIG. 5 with FIG. 4 for example), but the sidewall spacer remains on the vertical surfaces of the trenches (covering and protecting portions of the SOI layer through which the trenches pass).

Figure 6:
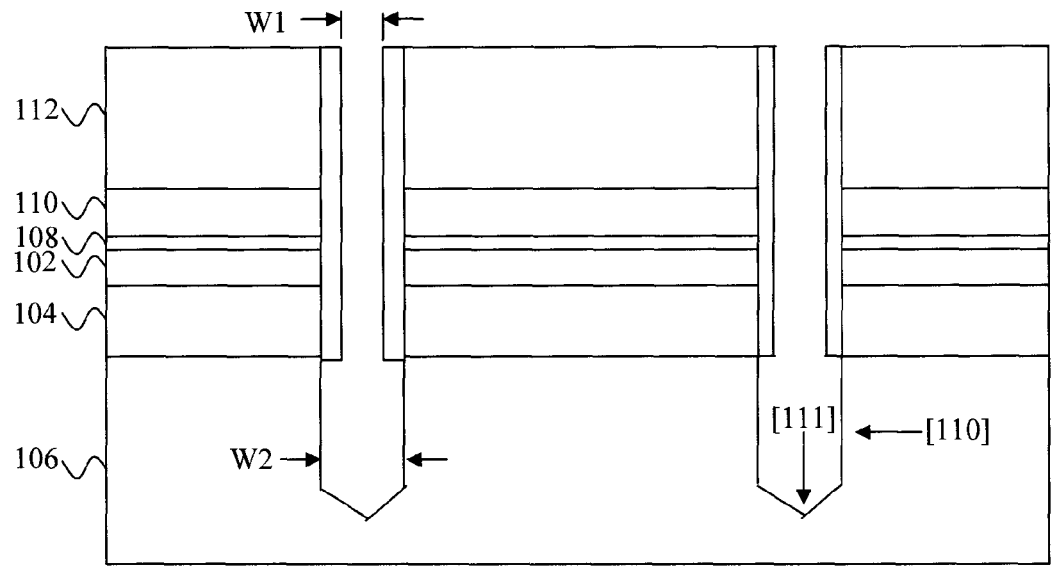
FIG. 6 is a cross-sectional diagram illustrating an optional step of laterally etching the trenches in the Si substrate to increase the widths, so to increase the total area of the trenches according to an embodiment of the present invention.

Optionally, the Si substrate 106 within the trenches can be etched laterally to increase the widths of the trenches and thereby increase the total area of the trenches. This optional step, also referred to herein as bottling, is illustrated in FIG. 6. As shown in FIG. 6, performing this step results in the trenches being wider at the bottom than at the top, like a bottle. By way of example only, in the example shown illustrated in FIG. 6, as a result of performing this bottling etch, the openings of the trench have a first width w1 (e.g., of from about 60 nm to about 120 nm) at the top and a second, larger width w2 (e.g., of from about 70 nm to about 130 nm) at the bottom.

Laterally increasing the width of the trench increases the device surface area. For an eDRAM device, capacitance is proportional to surface area. According to an exemplary embodiment, this lateral etching is performed using a wet etch (such as potassium hydroxide (KOH)) which is selective for etching Si. While some etching of the Si substrate 106 will occur at the bottom of the trenches, a Si-selective wet etch such as KOH etches faster in the [110] crystal plane direction than the [111] crystal plane direction, resulting in the lateral etch shown in FIG. 6. The remaining figures illustrating the process will proceed from the standpoint of the optional Si bottling step (of FIG. 6) having been performed. However, since the Si bottling step serves merely to increase the trench surface area, the exact same steps performed in the same manner would be carried out whether or not optional Si bottling as depicted in FIG. 6 were performed or not.

As described above, the starting Si substrate 106 may be doped or undoped. If the starting Si substrate 106 is undoped, then ion implantation may now be performed at this point in the process to dope the substrate. See FIG. 7. Doping the Si substrate 106 serves to lower the contact resistance between the silicide and the Si substrate (see also, FIG. 12, described below). If on the other hand, the starting Si substrate 106 is doped, then doping at this stage is not necessary. According to an exemplary embodiment, the Si substrate 106 is heavily doped as shown in FIG. 7 with B, As or P at a doping concentration of from about $2\times10^{18} cm^3$ to about $5\times10^{20}$ $cm^3$.

Figure 8:
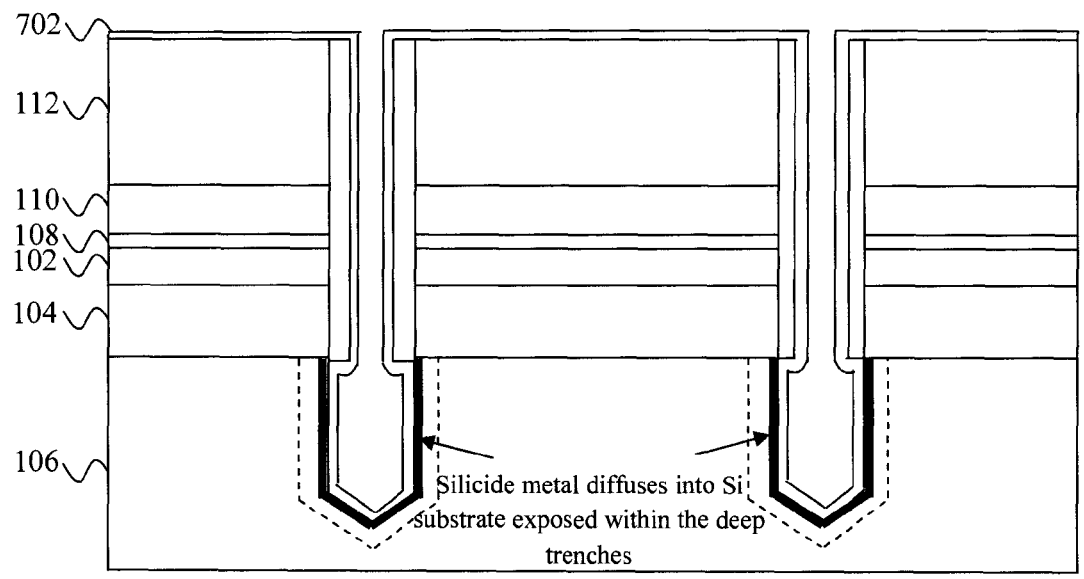
FIG. 8 is a cross-sectional diagram illustrating a thin layer of a silicide metal having been deposited onto the structure and into the deep trenches at a temperature of from about 400° C. to about 700° C. which will cause the deposited metal to diffuse into the exposed Si substrate within the deep trenches according to an embodiment of the present invention.
Figure 9:
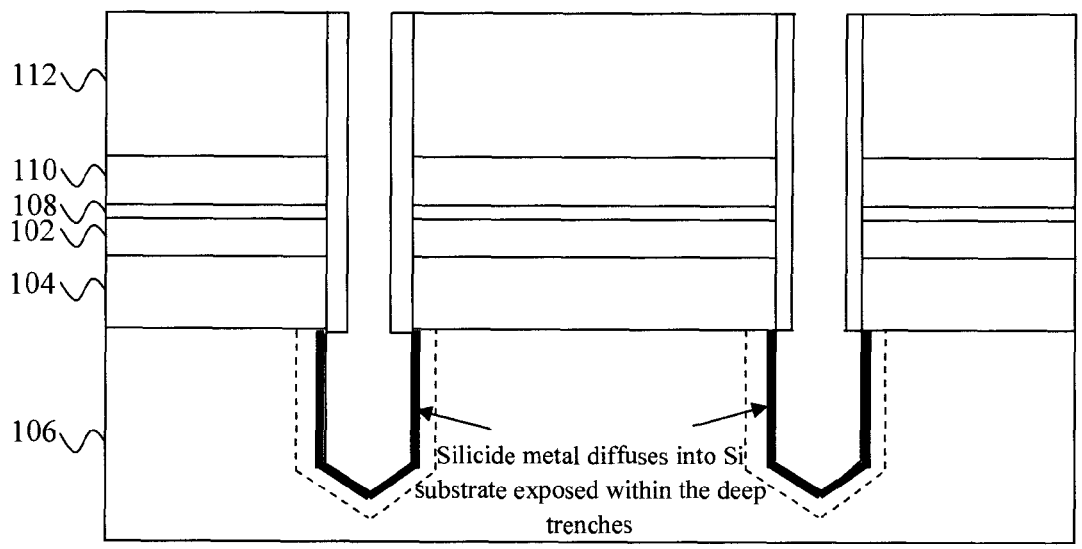
FIG. 9 is a cross-sectional diagram illustrating a wet etch having been performed to remove excess deposited metal selective to the silicide metal which has diffused into the exposed Si substrate within the deep trenches which remains after the wet etch according to an embodiment of the present invention.
Figure 10:
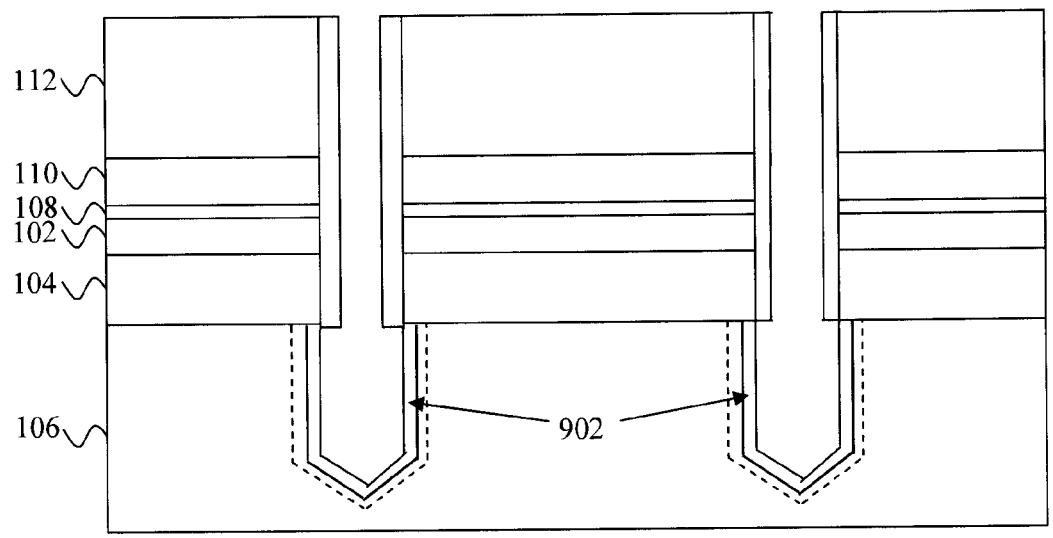
FIG. 10 is a cross-sectional diagram illustrating a high temperature anneal having been used to react the silicide metal that remains in the trench with the Si substrate to form a metal silicide which will serve as buried/bottom electrodes of the cell capacitor according to an embodiment of the present invention.

Next, a thin layer of a silicide metal (i.e., a thin metal layer) is deposited onto the wafer, lining the deep trenches, at a temperature of from about 400° C. to about 700° C. Under these conditions, at least a portion of the deposited metal will self-diffuse into the exposed Si substrate 106 within the trenches. See FIG. 8. Specifically, as shown in FIG. 8, the silicide metal 702 is deposited onto the structure and into the deep trenches using a conformal deposition process such as CVD or ALD. Any metal which can be deposited by CVD or ALD and can form a metal silicide may be employed. By way of example only, suitable silicide metals include, but are not limited to tungsten (W), tungsten nitride (WN), titanium (Ti), and/or platinum (Pt). By way of example only, the silicide metal may be deposited to a uniform thickness onto the structure/lining the trenches of from about 10 nm to about 20 nm.

The metal which diffuses into the Si substrate will form a metal-semiconductor alloy with the Si (e.g., a metal-Si alloy). A selective etch will be used to remove the excess deposited metal selective to the metal-semiconductor alloy—which will remain. It is notable that by way of this process, a self-aligned silicide can be formed (as described below) only where the silicide metal remains (i.e., where the Si is exposed within the trench—and not anywhere else on the wafer).

Namely, a wet etch is performed to remove excess deposited silicide metal. The wet etch will, however, not remove the silicide metal which has diffused into the exposed Si substrate 106 (the metal alloy) within the deep trenches. See FIG. 8. A suitable wet etch includes, but is not limited to Aqua Regia (mixture of HNO3, HCL and water), or a mixture of hot sulfuric acid and hydrogen peroxide.

A high temperature anneal is then used to react the silicide metal that remains in the trench (the metal-semiconductor alloy) with the Si substrate to form a metal silicide 902. See FIG. 10. According to an exemplary embodiment, this annealing step is performed at a temperature of greater than about 700° C., e.g., from about 700° C. to about 1,000° C. Using the above example of tungsten nitride as the silicide metal, annealing at these temperatures will cause the tungsten nitride to decompose to tungsten which reacts with the Si in the substrate to form tungsten silicide. By way of example only, the metal silicide 902 may be formed having a thickness of from about 2 nm to about 6 nm.

The metal silicide 902 will serve as the buried or bottom electrodes of the cell capacitor(s). A high-k dielectric 1002 is then deposited into the deep trenches, so as to line the trenches and to cover the metal silicide 902/bottom electrodes. See FIG. 11. Suitable high-k dielectric materials include, but are not limited to, hafnium oxide ($HfO_2$), hafnium silicate, lanthanum oxide ($LaO_2$) and lanthanum silicate.

Figure 11:
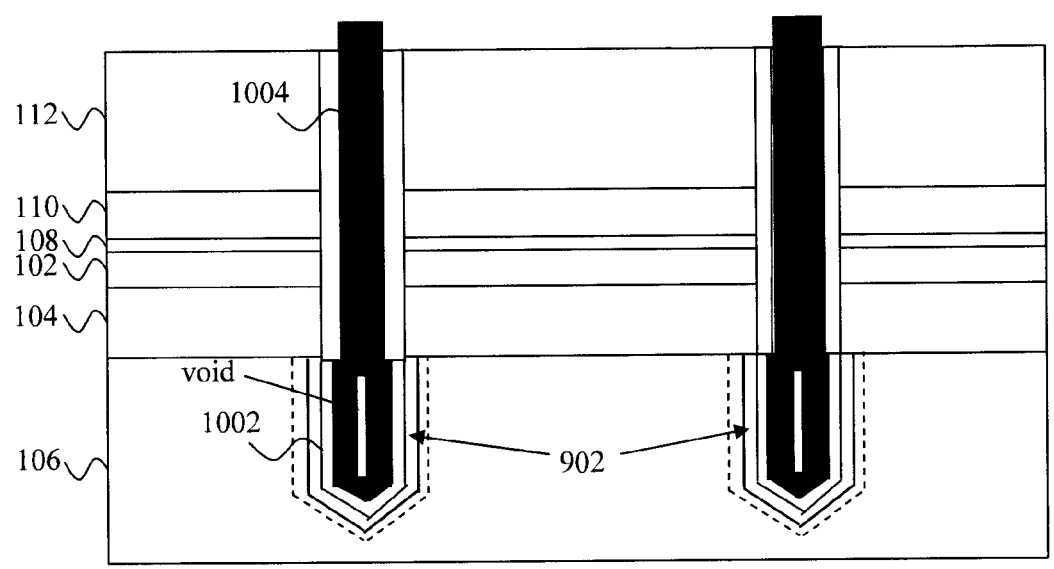
FIG. 11 is a cross-sectional diagram illustrating a high-k dielectric having been formed on the bottom electrodes and top electrodes having been formed in the trenches according to an embodiment of the present invention.

Top electrodes 1004 (of the cell capacitor(s)) are then formed in the deep trenches separated from the bottom electrodes by the high-k dielectric 1002. The top electrodes 1004 may be formed from a metal(s) or doped polysilicon. Suitable metals for use in forming the top electrode include, but are not limited to, titanium, titanium nitride (TiN), tantalum nitride (TaN), and TiN/poly silicon. By way of example only, the metal(s) or polysilicon for forming the top electrodes may be deposited using ALD or CVD. When a conformal deposition process such as ALD or CVD is used to deposit the electrode material, it is possible that a void can form within the top electrodes as shown in FIG. 11. Namely, when depositing material into a high aspect ratio trench, the material can build up at the opening of the trench and "pinch-off" the trench before the trench is fully filled with the material, resulting in such a void being formed. The presence (or absence of such a void—as the case may be) is immaterial to the performance or operation of the device.

Figure 12:
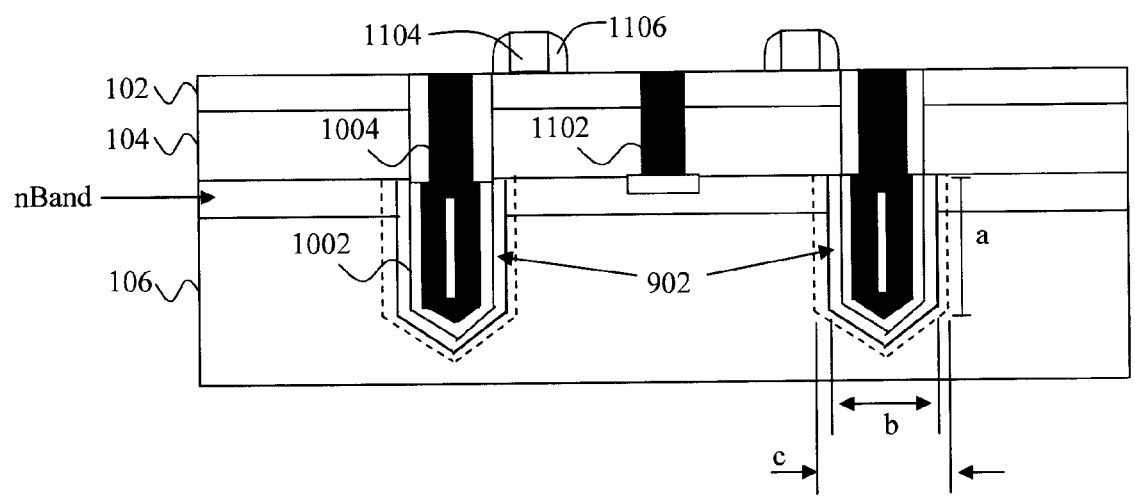
FIG. 12 is a cross-sectional diagram illustrating the pad nitride and pad oxide having been removed, the top electrodes having been polished to the surface of the wafer, a contact having been formed to the bottom electrode and one or more cell transistors having been formed on the wafer according to an embodiment of the present invention.

The pad oxide layer 108, the pad nitride layer 110 and the hardmask 112 can then be removed, e.g., using chemical mechanical polishing (CMP). See FIG. 12. This step further recesses the top electrodes 1004. As shown in FIG. 12, the Si substrate 106 may be implanted with an n-type dopant (such as arsenic or phosphorous) to form an nBand in a top surface of the Si substrate 106. According to an exemplary embodiment, the n-type dopant is present in the nBand at a concentration of from about $1\times10^{17}$ $cm^3$ to about $1\times10^{18}$ $cm^3$. The nBand (in conjunction with the buried/bottom electrode contact 1002—see FIG. 12) permit access to the buried/bottom electrode. A buried/bottom electrode contact 1102 may be formed using conventional techniques known to those of skill in the art. With this, fabrication of the memory cell capacitor is complete.

When used in an eDRAM device, each of the cell capacitors will be part of a memory cell of the device. The buried/bottom electrode contact 1002 to the nBand can serve as a shared bitline contact to the cells. Individual wordlines can be formed by polysilicon gated memory cell transistors in contact with each of the cell capacitors. See FIG. 12. In the exemplary configuration shown in FIG. 12, the gate lines 1104 of the cell transistors (in this case which are composed of polysilicon) serve as the wordlines of the device. Spacers 1106 (e.g., nitride spacers) are present on opposite sides of the gate lines 1104. The techniques for forming the gates and for forming the spacers on opposite sides of the gates are known to those of skill in the art, and thus are not described further herein. See, for example, U.S. Pat. No. 7,564,086 issued to Kwon et al., entitled "Self-Aligned, Silicided, Trench-Based DRAM/EDRAM Processes with Improved Retention," the contents of which are incorporated by reference herein.

As described above, doping the Si substrate 106 serves to lower the contact resistance between the silicide and the Si substrate. See, for example the description of FIG. 7, above. According to an exemplary embodiment, the contact resistance (Rc) between the silicide (buried/bottom electrode) and the Si substrate is from about $1\times10^{-6}$ ohm-$cm^2$ to about $1\times10^{-9}$ ohm-$cm^2$. FIG. 12 highlights some exemplary dimensions of the cell capacitor, namely, capacitor depth a, capacitor width b, and implant dopant width c. Using an illustrative example, assume a=3.5 micrometers, b=100 nm and c=400 nm, which are exemplary values of the present devices. Contact resistance $Rc=1\times10^{-6}/(3.14\times100\times10^{-7}\times3.5\times10^{-4})\sim100$ ohm. The Si resistivity around the buried/bottom electrode is about $1\times10^{-2}$ ohm-cm. The resistivity of Si $(Rsi)=1\times10^{-2}\times3.5\times10^{-4}/(3.14\times((200\times10^{-7})^2))\sim3,000$ ohm (without the metal plate).

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A memory cell capacitor, comprising:
    a silicon wafer comprising a silicon-on-insulator (SOI) wafer having an SOI layer separated from a silicon substrate by a buried oxide (BOX);
    at least one trench in the silicon wafer that extends through the SOI layer, through the BOX and partway into the silicon substrate, wherein other than an n-band portion of the silicon substrate and a portion of the silicon substrate adjacent to the trench the silicon substrate is undoped, and wherein the portion of the silicon substrate adjacent to the trench is implanted with a dopant;
    sidewall spacers on vertical surfaces of the trench that cover and protect portions of the SOI layer through which the trench passes;
    a silicide within the trench that is formed in the silicon substrate and serves as a bottom electrode of the memory cell capacitor, wherein the portion of the silicon substrate implanted with the dopant extends out from the trench into the silicon substrate beyond the silicide, and wherein a contact resistance between the bottom electrode and the portion of the silicon substrate adjacent to the trench that is implanted with the dopant is from about $1\times10^{-6}$ ohm-$cm^2$ to about $1\times10^{-9}$ ohm-$cm^2$;
    a dielectric in the trench covering the bottom electrode; and
    a top electrode in the trench separated from the bottom electrode by the dielectric.

2. The memory cell capacitor of claim 1, wherein the dielectric comprises a high-k material.

3. The memory cell capacitor of claim 2, wherein the high-k material is selected from the group consisting of: hafnium oxide, hafnium silicate, lanthanum oxide, and lanthanum silicate.

4. The memory cell capacitor of claim 1, wherein the top electrode comprises a metal.

5. The memory cell capacitor of claim 1, wherein the top electrode is formed from titanium and polysilicon.

6. The memory cell capacitor of claim 1, wherein the sidewall spacers comprise a nitride material.

7. The memory cell capacitor of claim 1, wherein the silicon wafer is doped with boron, arsenic or phosphorous at a concentration of from about $2\times10^{18} cm^3$ to about $5\times10^{20}$ $cm^3$.

8. The memory cell capacitor of claim 1, further comprising:
    a contact to the bottom electrode.

9. The memory cell capacitor of claim 1, wherein the trench has a depth-to-width aspect ratio of at least 35:1.

10. The memory cell capacitor of claim 1, wherein the sidewall spacers each have a first surface and a second surface opposite the first surface, wherein the first surface is in contact with the SOI layer and the second surface is coplanar with one of the vertical surfaces of the trench in the silicon substrate.

11. The memory cell capacitor of claim 1, wherein the sidewall spacers are in direct contact with the top electrode and separate the top electrode from the SOI layer and the BOX.

12. The memory cell capacitor of claim 1, wherein the dielectric is only present between the top electrode and the bottom electrode.

* * * * *